(12) United States Patent
Mochizuki et al.

(10) Patent No.: US 9,761,609 B2
(45) Date of Patent: Sep. 12, 2017

(54) STRUCTURE HAVING GROUP III-V, GE AND SIGE FINS ON INSULATOR

(71) Applicant: International Business Machines Corporation, Armonk, NY (US)

(72) Inventors: Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/746,158

(22) Filed: Jun. 22, 2015

(65) Prior Publication Data

US 2016/0322392 A1 Nov. 3, 2016

Related U.S. Application Data

(63) Continuation of application No. 14/700,672, filed on Apr. 30, 2015.

(51) Int. Cl.
*H01L 27/12* (2006.01)
*H01L 21/02* (2006.01)
(Continued)

(52) U.S. Cl.
CPC .... *H01L 27/1211* (2013.01); *H01L 21/02532* (2013.01); *H01L 21/02538* (2013.01);
(Continued)

(58) Field of Classification Search
CPC ......... H01L 21/76264; H01L 21/76251; H01L 29/0649; H01L 29/161; H01L 29/16;
(Continued)

(56) References Cited

U.S. PATENT DOCUMENTS

| | | | |
|---|---|---|---|
| 2005/0017351 A1 | 1/2005 | Ravi | |
| 2007/0054467 A1* | 3/2007 | Currie | ............... H01L 21/76254 438/458 |

(Continued)

FOREIGN PATENT DOCUMENTS

| | | |
|---|---|---|
| WO | 0215244 A2 | 2/2002 |
| WO | 0215244 A3 | 2/2002 |

*Primary Examiner* — Evan Pert
*Assistant Examiner* — Changhyun Yi
(74) *Attorney, Agent, or Firm* — Harrington & Smith

(57) ABSTRACT

A method provides a first substrate supporting an insulator layer having trenches formed therein; filling the trenches using an epitaxial growth process with at least semiconductor material; planarizing tops of the filled trenches; forming a first layer of dielectric material on a resulting planarized surface; inverting the first substrate wafer to place the first layer of dielectric material in contact with a second layer of dielectric material on a second substrate; bonding the first substrate to the second substrate through the first and second layers of dielectric material to form a common layer of dielectric material; and removing the first substrate and a first portion of the filled trenches to leave a second portion of the filled trenches disposed upon the common dielectric layer. The removed first portion of the filled trenches contains dislocation defects. The method then removes the insulator layer to leave a plurality of Fin structures.

13 Claims, 5 Drawing Sheets

(51) Int. Cl.
  *H01L 21/18*    (2006.01)
  *H01L 21/304*   (2006.01)
  *H01L 21/306*   (2006.01)
  *H01L 21/3105*  (2006.01)
  *H01L 29/06*    (2006.01)
  *H01L 21/8258*  (2006.01)
  *H01L 21/84*    (2006.01)

(52) U.S. Cl.
  CPC ...... *H01L 21/02551* (2013.01); *H01L 21/187* (2013.01); *H01L 21/304* (2013.01); *H01L 21/30625* (2013.01); *H01L 21/3105* (2013.01); *H01L 29/0657* (2013.01); *H01L 21/8258* (2013.01); *H01L 21/845* (2013.01)

(58) Field of Classification Search
  CPC ..... H01L 21/845; H01L 29/201; H01L 29/34; C12N 15/8201; C12N 15/8241; C12N 15/8261
  USPC .......................................... 257/351; 438/479
  See application file for complete search history.

(56) References Cited

U.S. PATENT DOCUMENTS

| | | | |
|---|---|---|---|
| 2008/0001169 A1* | 1/2008 | Lochtefeld | H01L 21/2018 257/190 |
| 2009/0065047 A1* | 3/2009 | Fiorenza | H01L 31/078 136/255 |
| 2010/0176371 A1* | 7/2010 | Lochtefeld | H01L 21/02381 257/13 |
| 2011/0317829 A1 | 12/2011 | Ficke et al. | |
| 2013/0168771 A1* | 7/2013 | Wu | H01L 27/1211 257/351 |
| 2014/0099774 A1 | 4/2014 | Vincent | |
| 2014/0264446 A1 | 9/2014 | Basu et al. | |
| 2014/0264607 A1 | 9/2014 | Basu et al. | |
| 2015/0279725 A1* | 10/2015 | Waldron | H01L 21/76251 257/506 |
| 2015/0279947 A1 | 10/2015 | Waldron | |

* cited by examiner

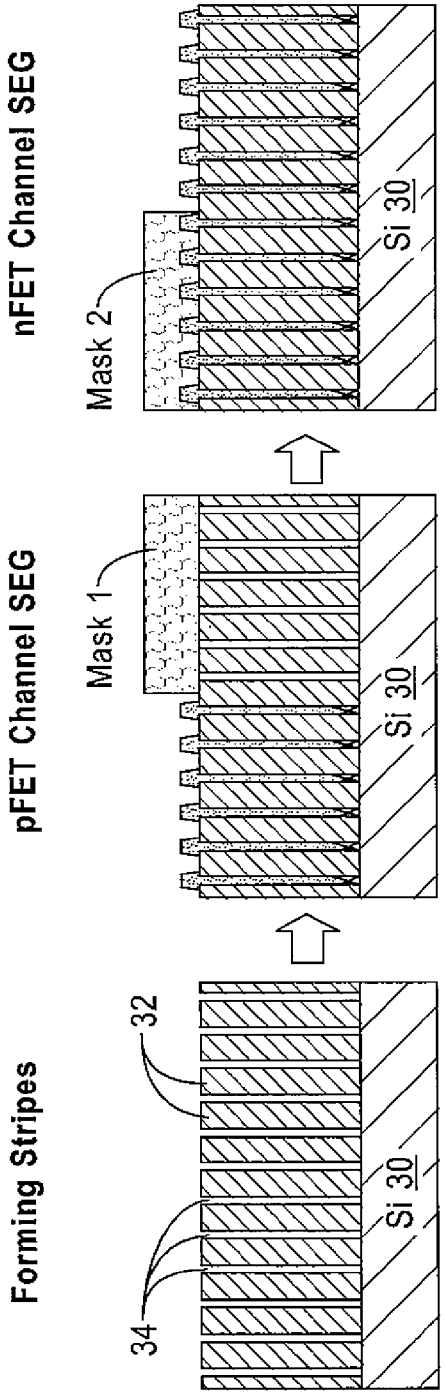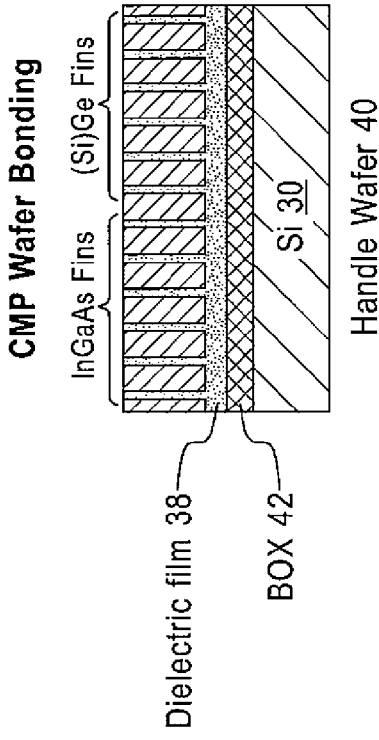

STRUCTURE HAVING GROUP III-V, GE AND SIGE FINS ON INSULATOR

CROSS-REFERENCE TO A RELATED US PATENT APPLICATION

This patent application is a continuation application of copending U.S. patent application Ser. No. 14/700,672, filed on Apr. 30, 2015, the disclosure of which is incorporated by reference herein in its entirety.

TECHNICAL FIELD

The embodiments of this invention relate generally to semiconductor devices and fabrication techniques and, more specifically, relate to the fabrication of semiconductor transistor devices including FINFETs. The embodiments of this invention also relate to aspect ratio trapping and wafer bonding techniques.

BACKGROUND

For more than three decades, the continued miniaturization of metal oxide semiconductor field effect transistors (MOSFETs) has driven the worldwide semiconductor industry. Various impediments to continued scaling have been predicted for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, the development of further methods for improving performance, in addition to scaling, has become critical. One such method involves using high mobility materials, other than silicon, for CMOS such as Group III-V semiconductors or SiGe or Ge.

Methods for fabricating Fin structures on an insulator structure (where the Fin can be composed of, for example, SiGe, Ge, and Group semiconductor materials) are currently being explored. In those cases where wafer bonding techniques are used followed by Fin patterning a problem can arise that is related to a presence of crystalline defects in the Fin material. Another problem area relates to Fin patterning issues such as Fin taper, Fin sidewall roughness, reactive ion etching (RIE) damage and post RIE cleaning.

SUMMARY

In a first aspect thereof the embodiments of this invention provide a method that comprises providing a first substrate supporting an insulator layer having trenches formed therein; filling the trenches using an epitaxial growth process with at least one type of semiconductor material; planarizing tops of the filled trenches and forming a first layer of dielectric material on a resulting planarized surface; inverting the first substrate wafer to place the first layer of dielectric material in contact with a second layer of dielectric material disposed on a second substrate; bonding the first substrate to the second substrate through the first layer of dielectric material and the second layer of dielectric material to form a common layer of dielectric material; removing the first substrate and a first portion of the filled trenches to leave a second portion of the filled trenches disposed upon the common layer of dielectric material, where the first portion of the filled trenches contains dislocation defects in the semiconductor material resulting from the epitaxial growth process; and removing the insulator layer to leave a plurality of Fin structures disposed upon the common layer of dielectric material, where each Fin structure corresponds to one of the filled trenches.

In another aspect thereof the embodiments of this invention provide a structure that comprises an upper surface and a lower surface. The upper surface is a first surface of a first substrate and the lower surface is a first surface of a second substrate. The structure further comprises a layer of insulator material having a first surface and a second surface opposite the first surface, where the first surface of the layer of insulator material is disposed on a second surface of the first substrate that is opposite the first surface of the first substrate. The layer of insulator material has a plurality of trenches formed therein that extend through the layer of insulator material from the second surface of the layer of insulator material to the first surface of the layer of insulator material. The trenches are filled at least one type of semiconductor material. The structure further includes a dielectric layer disposed between the second surface of the layer of insulator material and a second surface of a second substrate that is opposite to the first surface of the second substrate. In the structure the semiconductor material that fills the trenches contains dislocation defects that are primarily concentrated at and near to the second surface of the first substrate.

BRIEF DESCRIPTION OF THE SEVERAL VIEWS OF THE DRAWINGS

FIGS. 9A-9D, collectively referred to as FIG. 9, illustrate an embodiment further in accordance with this invention where each channel Fin material can be chosen for NFET and PFET as needed.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process typically ranges from about 550° C. to about 900° C. Although higher temperature typically results in faster deposition, the faster deposition may result in crystal defects and film cracking.

Figure 1:
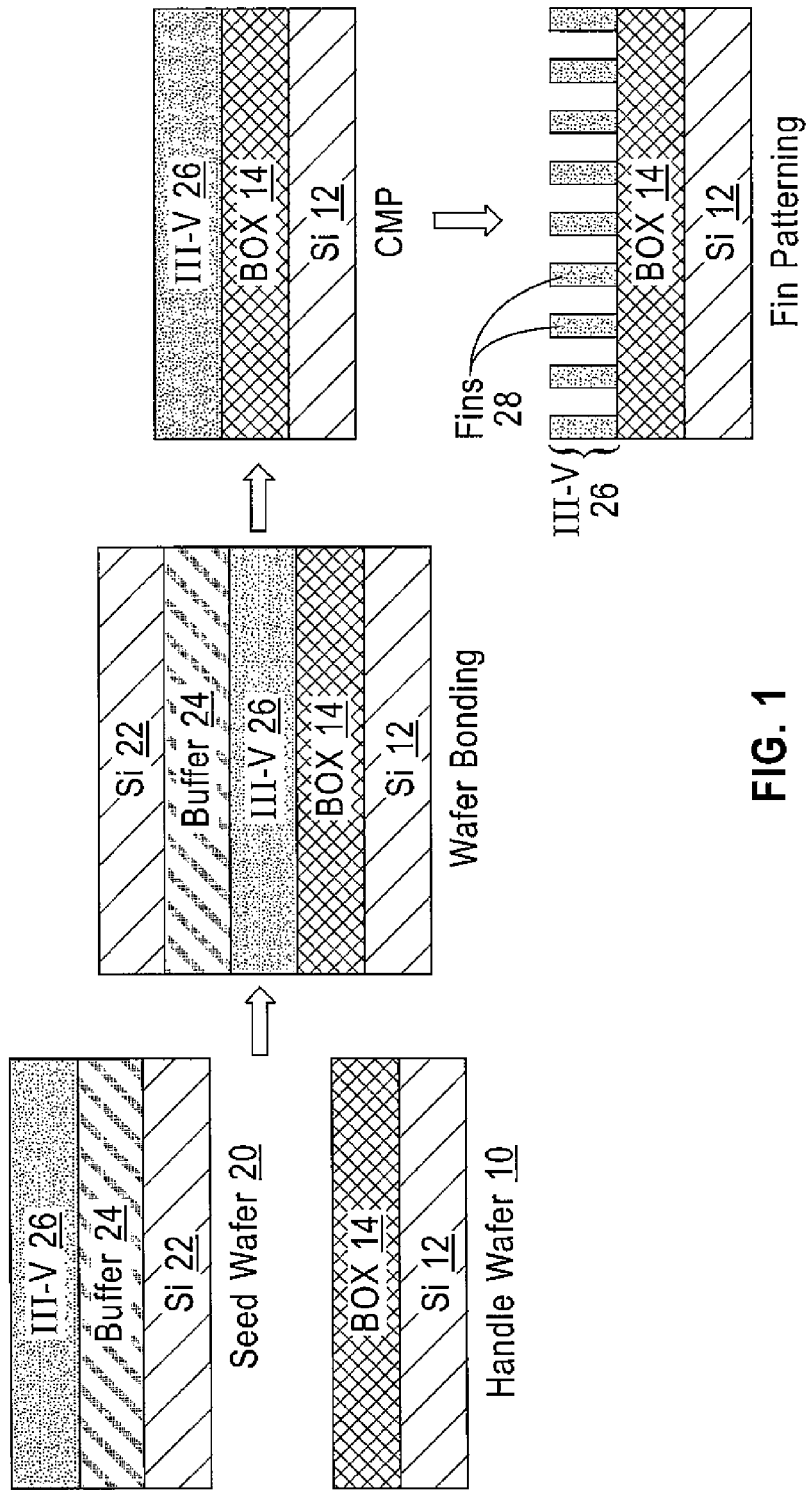
FIG. 1 shows in enlarged cross-sectional views (not to scale) an overview of a procedure to fabricate Fins composed of a Group III-V material on an insulating substrate.
Figure 2:
FIG. 2 illustrates a first step of a method in accordance with this invention where a seed wafer and a handle wafer are provided.

FIG. 1 shows in enlarged cross-sectional views (not to scale) an overview of a procedure to fabricate Fins composed of a Group III-V semiconductor material on an insulating substrate (one composed in this example of a Silicon substrate 12 having an overlying buried oxide (BOX) layer 14). The Silicon substrate 12 and BOX layer can be provided on what may be referred to as a handle wafer 10. Also provided is what may be referred to as a seed wafer 20 having in this non-limiting example a Silicon substrate 22, a suitable buffer layer 24 for Group III-V material and a layer 26 of a desired Group III-V semiconductor material (e.g., binaries such as, e.g., GaAs, GaP, GaSb, InP, InAs, InSb, tertiaries such as, e.g., InGaAs and quaternaries such as, e.g., AlInGaP). In other cases the semiconductor material could be, for example, a Silicon Germanium alloy (SiGe) or Ge.

The seed wafer 20 is inverted and the Group III-V layer 26 is wafer bonded to the BOX layer 14 of the handle wafer 10. The Si layer 22 and buffer layer 24 of the seed wafer 20 are then removed by any suitable process, such as Smart Cut® or by grinding and chemical mechanical polishing (CMP). The remaining Group III-V layer 26 is then photolithographically patterned and etched, such by an RIB procedure, to define Group III-V Fins 28 that are disposed on the BOX layer 14. Although not shown in FIG. 1, the Fins 28 are then further processed to define source and drain regions, and suitable gate structures and conductors are formed in order to provide transistors, such as PFETs and NFETs as needed.

However, the resulting Fins 28 are susceptible to the above mentioned problems related to the presence of crystal defects in the Fins 28 and the patterning issues related to RIE.

As will be described with reference to FIGS. 2-9 the exemplary embodiments of this invention overcome these and other problems. A fabrication method begins in FIG. 2 with a Silicon seed wafer 30 and a Silicon handle wafer 40. The wafers 30 and 40 can be of any conventional size and thickness. In other embodiments the wafers 30 and 40 can be composed of, for example, SiGe, or a Group III-V, or a Group II-VI wafer material.

Figure 3:
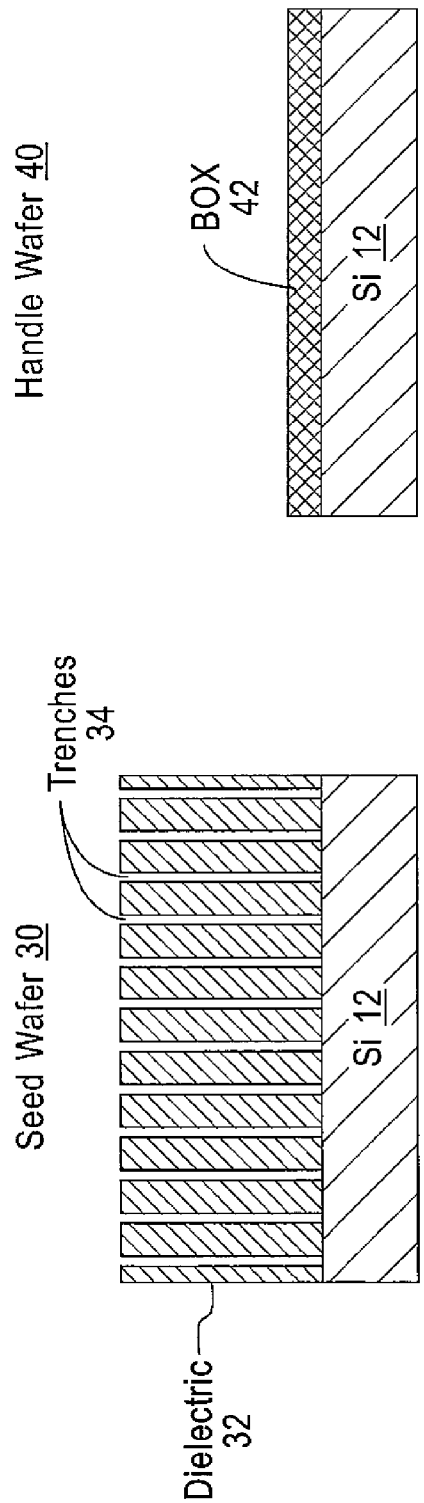
FIG. 3 shows the formation on the seed wafer of an insulator stripe pattern for ART (aspect ratio trapping) in preparation for semiconductor material epitaxy.

FIG. 3 shows the formation on the seed wafer 30 of an insulator stripe pattern for aspect ratio trapping (ART) in preparation for at least one of SiGe, Ge, III-V epitaxy. A Silicon oxide layer 42 is formed on the handle wafer 40 (labeled in the Figures as a buried oxide (BOX) layer for convenience). In the ART technique a dielectric layer 32, e.g., $SiO_2$, $Si_3N_4$ or $SiO_xN_y$, is grown on the surface of the seed wafer 30 and then parallel trenches 34 are etched through the dielectric layer 32 to the surface of the seed wafer 30. The trench width corresponds to the desired width of the Fins that will be formed. Suitable Fin widths are in a range of about 4 nm to about 20 nm, with about 6 nm to about 10 nm being one exemplary desired range of widths. The trench depth preferably has an aspect ratio of at least 1:2 (width to depth), but higher aspect ratios of 1:10 to 1:30 are preferred. A portion of the dielectric layer 32 and material that will fill the trenches will be subsequently removed. In general the trench depth will be greater than a desired final Fin height (that may be, for example, in a range of about 30 nm to about 100 nm).

Figure 4:
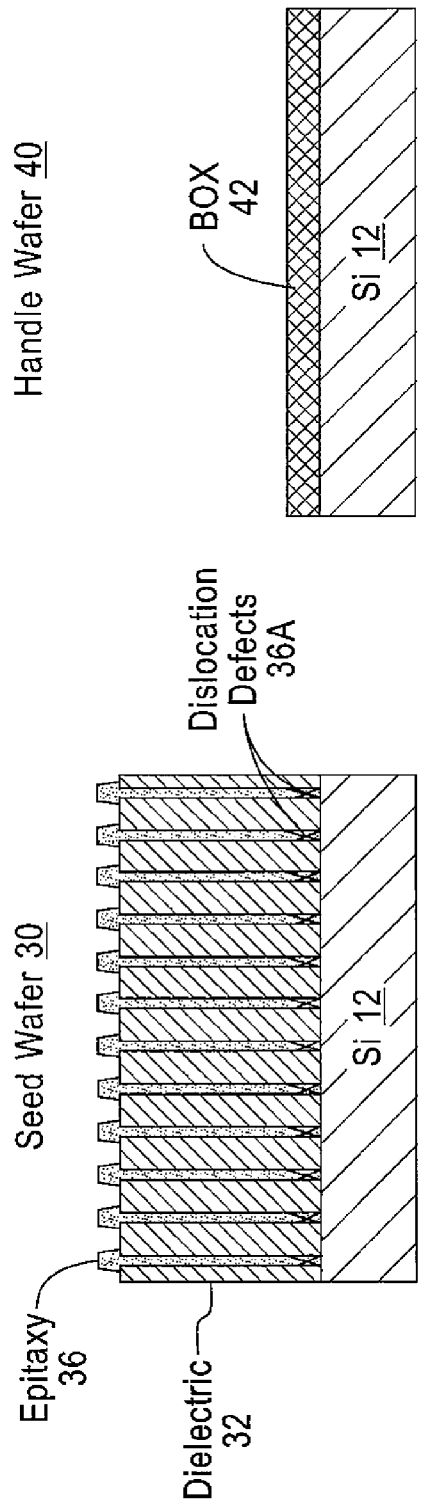
FIG. 4 illustrates a selective epitaxial growth (SEG) process to grow a desired semiconductor material in the trenches that define the ART insulator stripe pattern.

In FIG. 4 a selective epitaxial growth (SEG) process is performed. In addition to the various epitaxial growth process apparatus that were mentioned above, the embodiments of this invention can also use metalorganic chemical vapor phase deposition (MOCVD) and metalorganic vapor phase epitaxy (MOVPE) to grow a desired semiconductor material (e.g., SiGe, Ge, Group III-V, Group II-VI) epitaxial film 36 in the trenches 34 that define the ART insulator stripe pattern. As can be seen there will exist at the trench bottoms some dislocation defects 36A in the epitaxial film 36 arising from initial semiconductor growth along certain preferred angles (e.g., 60°) depending on the semiconductor material. The defects will generally propagate until they encounter the trench side walls. Above this initially grown volume of semiconductor material the epitaxial film with be (ideally) substantially defect free. The thickness of that portion of the filled trench that contains the majority of the dislocation defects can be a function of at least the type of semiconductor material used to fill the trench, the selected SEG process and the trench width. In general the thickness of the portion of the filled trench that contains the majority of the dislocation defects can be twice the trench width.

Figure 5:
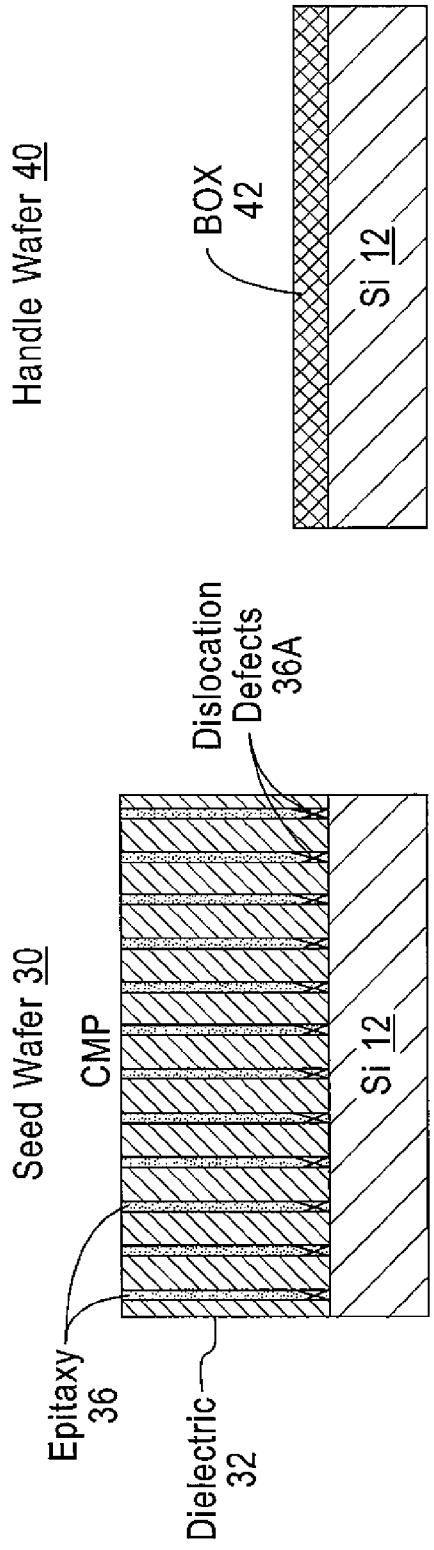
FIG. 5 shows a result of a selective removal of a top-most portion of a dielectric layer 32 and the semiconductor material that fills the trenches.

FIG. 5 shows a result of a selective removal of the top-most portion of the dielectric layer 32 and the epitaxial film 36 that fills the trenches 34. CMP is one preferred technique to planarize and polish the top of the seed wafer structure in preparation for a wafer bonding procedure. It can be noted that the dislocation defects 36A are still present in the semiconductor epitaxial film at the trench bottoms.

Figure 6:
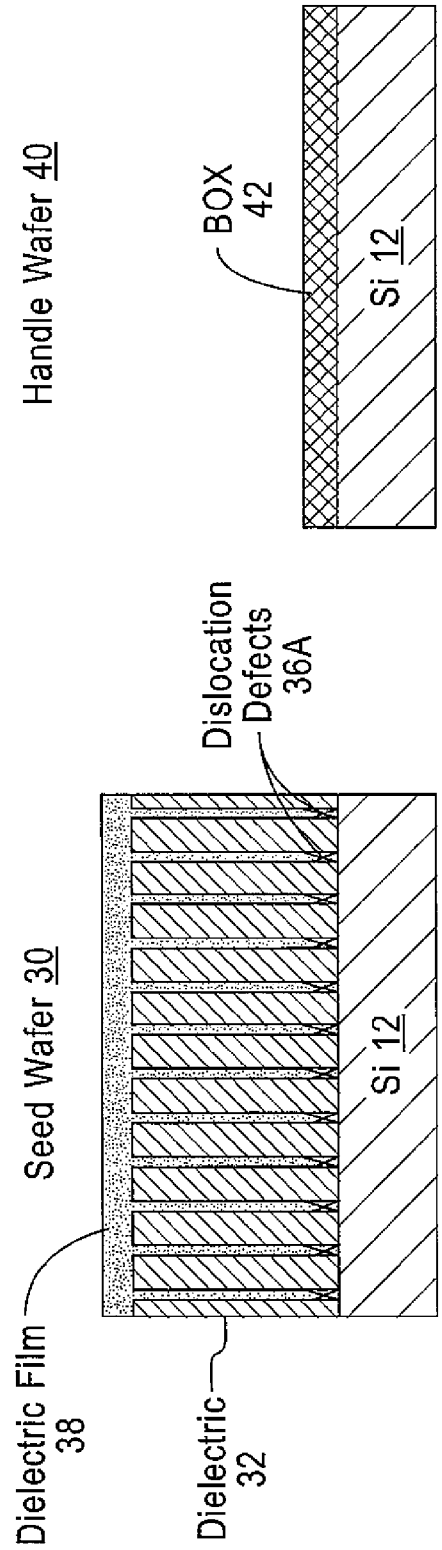
FIG. 6 shows a result of a deposition of a dielectric film over a polished top of the seed wafer structure.

FIG. 6 shows a result of the deposition of a dielectric film 38 (e.g., an oxide or a nitride compatible with the Silicon oxide layer 42 of the handle wafer 40) over the planarized and polished top of the seed wafer 30 structure shown in FIG. 5. Silicon oxide is the preferred dielectric material for the layer 42.

Figure 7:
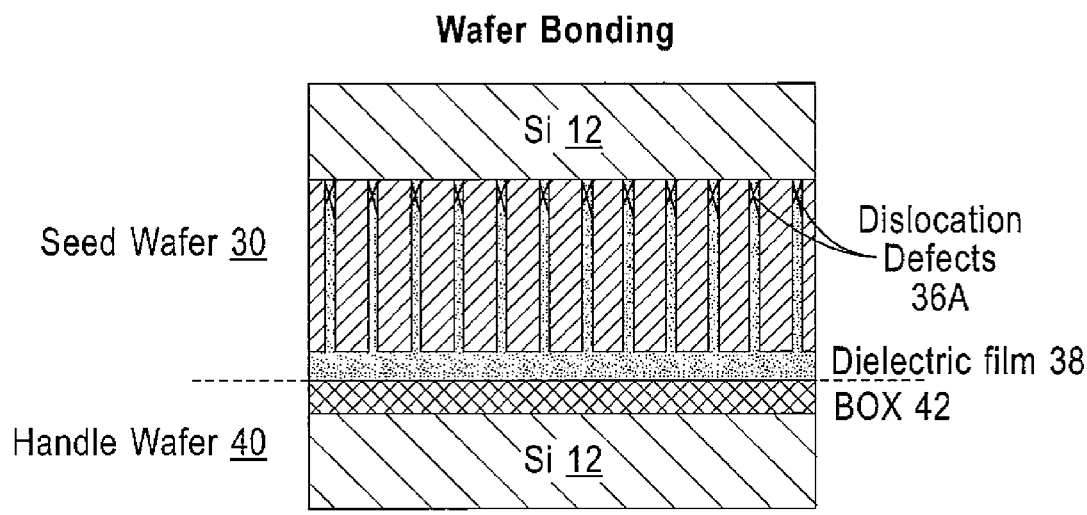
FIG. 7 shows a result of a wafer bonding operation wherein the seed wafer structure formed in FIGS. 2-6 is inverted and a top surface of the dielectric film is placed in contact with and bonded to a top surface of the handle wafer BOX layer.

FIG. 7 shows a result of a wafer bonding operation wherein the seed wafer structure formed thus far is inverted and the top surface of the dielectric film 38 is placed in contact with the top surface of the Silicon oxide layer 42. Note that the Silicon oxide layer 42 need not be formed or present prior to this step. During the wafer bonding operation, which is a well-known technique, heat and pressure are applied to the two structures to be bonded in order to bond or fuse together the dielectric film 38 and the Silicon oxide layer 42. Note that after the wafer bonding operation the Silicon oxide layer 42 may be referred to as being a "buried" oxide layer.

Figure 8:
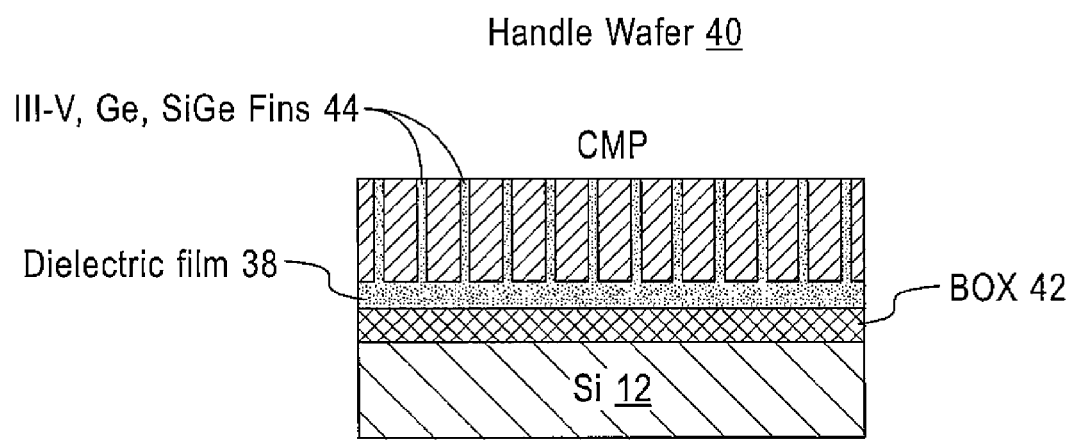
FIG. 8 illustrates a material removal operation that removes the substrate of the seed wafer and that portion of the ART epitaxy and trenches containing dislocation defects to obtain a desired Fin height.

FIG. 8 illustrates the performance of a material removal operation that removes the substrate of the seed wafer 30 and that portion of the ART epitaxy and trenches containing the dislocation defects 36A. The material removal operation is performed to achieve the desired height of Fins 44 (composed of, for example, one or more of SiGe, Ge and Group III-V material) relative to the top surface of the bonded BOX layer 42 and dielectric film 38 that now form a BOX layer. In practice the seed wafer substrate 30 may have a thickness of about 875 μm and the dielectric material layer 32 that contains the trenches 34 may have a thickness of about, for example, 100 nm to about 200 nm. In order to facilitate the removal of this substantial amount of material it is preferred to use a multi-step material removal process such one based on an initial grinding operation to remove the bulk of the material, and then performing a lapping process followed by a CMP process to achieve the final desired Fin height and surface quality.

A next step removes the dielectric (insulator) material 32 that exists between the Fins 44 leaving free-standing Fin structures that can be further processed as needed to form FinFETs and any other types of Fin-based devices for a semiconductor chip of interest. The dielectric material removal process is specific to the type of dielectric material 32 that is used for the ART process. Examples of suitable and compatible dielectric material removal processes, selected so as not to have a detrimental effect on shape and/or surface quality of the Fins 44, include selective reactive ion etching (RIE) and selective wet etching.

It can be appreciated that as a result of the material removal process shown in FIG. 8 that the portion of the epitaxial semiconductor material 36 deposited at and near to the bottom of the trenches 34, i.e., that portion containing the majority of the dislocation defects 36A, is physically abraded away and does not form a part of the final Fin structures 44. As a result the problem discussed above that is related to crystalline defects in the Fins is addressed and overcome. Further, the use of the ART technique in conjunction with the preferred wafer bonding technique addresses and overcomes the Fin patterning issues that were discussed above, such as those related to Fin taper, Fin sidewall roughness, RIE damage and post-RIE cleaning. In essence, no damage to the Fins 44 occurs due to any Fin formation RIE which is not required by the method in accordance with this invention.

FIG. 9 shows an embodiment further in accordance with this invention where each channel Fin material can be chosen for NFET and PFET as needed. FIG. 9A shows the seed wafer 30 with a set of trenches 34 formed in the dielectric material layer 32 as in FIG. 3. FIG. 9B shows a result of application of a first mask (Mask_1) to a first subset of the trenches 34 and the deposition by selective epitaxial growth (SEG) of a desired PFET channel semiconductor material into an unmasked second subset of the trenches 34. As a non-limiting example the PFET channel semiconductor material could be SiGe. FIG. 9C shows a result of a removal of the first mask and the application of a second mask (Mask_2) to the second subset of the trenches 34, followed by the deposition by SEG of a desired NFET channel semiconductor material into the now unmasked first subset of the trenches 34. As a non-limiting example the NFET channel semiconductor material could be InGaAs. Processing then continues as was described for FIGS. 5, 6, 7 and 8 to perform the CMP procedure on the semiconductor material deposited by SEG, the growth of the dielectric film 38, the inversion of the seed wafer 30 and the wafer bonding of the seed wafer 30 to the handle wafer 40, and the removal of the seed wafer 30 and a portion of the ART structure as in FIG. 8. This latter step also removes the portion of the semiconductor material at the trench bottoms having the high concentration of dislocation defects 36A. The result, shown in FIG. 9D, is a structure having high quality first Fins comprised of SiGe and second Fins comprised of InGaAs that are disposed over the common dielectric layer comprised of the dielectric film 38 and the BOX layer 42.

In FIG. 9 the masking and SEG steps could be performed in either the order shown or in a reverse order to deposit the NFET channel material first and then the PFET channel material. Furthermore, in some cases three or more masks could be used in conjunction three of more SEG operations in order to provide three of more FINFET channel material instances on the same common dielectric layer comprised of the dielectric film 38 and the Silicon oxide layer 42.

It is noted that any one of the structures shown in FIGS. 2-9 could be viewed as an intermediate structure formed during the overall process of providing the Fins 44 on the common insulator layer.

It is to be understood that although the exemplary embodiments discussed above with reference to FIGS. 2-9 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching and other material removal processes may be used by those skilled in the art. Further, the exemplary embodiments are not intended to be limited to only those semiconductor materials, dielectrics, layer thicknesses and the like that were specifically disclosed above. Any and all such and similar modifications of the teachings of this invention will still fall within the scope of this invention.

What is claimed is:

1. A structure, comprising:
   an upper surface and a lower surface, the upper surface being a first surface of a first substrate and the lower surface being a first surface of a second substrate;
   a layer of insulator material having a first surface and a second surface opposite the first surface of the layer of insulator material, the first surface of the layer of insulator material being disposed on a second, planar surface of the first substrate that is opposite the first surface of the first substrate, the layer of insulator material having a plurality of trenches formed therein that extend completely through the layer of insulator material from the second surface of the layer of insulator material to the first surface of the layer of insulator material and the second, planar surface of the first substrate, the trenches being filled with at least one type of semiconductor material that extends between and terminates on the second, planar surface of the first substrate and the second surface of the layer of insulator material; and
   a dielectric layer comprising a film of dielectric material having a first surface and an opposing second surface, the first surface commonly connecting ends of the semiconductor material filling the trenches, the dielectric layer further comprising an oxide layer disposed on the second surface of the film of dielectric material, the dielectric layer being disposed between the second surface of the layer of insulator material and a second surface of the second substrate that is opposite to the first surface of the second substrate;
   wherein the semiconductor material that fills the trenches contains dislocation defects that are primarily concentrated at and near to the second, planar surface of the first substrate.

2. The structure of claim 1, where the dielectric layer is a fused layer that bonds the first substrate and the layer of insulator material to the second substrate.

3. The structure of claim 1, wherein the trenches are filled with at least one of Ge, SiGe, Group III-V and a Group II-VI semiconductor material.

4. The structure of claim 1, where in a first subset of the trenches is filled with a first semiconductor material selected for forming PFETs, and a second subset of the trenches is filled with a second semiconductor material selected for forming NFETs.

5. The structure of claim 1, where the trenches are filled with epitaxially grown semiconductor material.

6. The structure of claim 1, where the structure is an intermediate structure formed during a process of fabricating semiconductor Fins on a surface of the dielectric layer.

7. The structure of claim 1, where the trenches are filled with epitaxially grown semiconductor material, and where an epitaxial growth process that is used to fill the trenches from the second, planar surface of the first substrate to the second surface of the layer of insulator material is one of metalorganic chemical vapor phase deposition, metalorganic vapor phase epitaxy and molecular beam epitaxy carried out as part of an aspect ratio trapping procedure.

8. The structure of claim 1, where the layer of insulator material is comprised of $SiO_2$.

9. The structure of claim 1, where the layer of insulator material is comprised of $Si_3N_4$.

10. The structure of claim 1, where the layer of insulator material is comprised of $Si_3O_xN_y$.

11. The structure of claim 1, where the trenches have a depth from the second, planar surface of the first substrate to the second surface of the layer of insulator material in a range of about 30 nm to about 100 nm.

12. The structure of claim 1, where the trenches have a width in a range of about 4 nm to about 20 nm.

13. The structure of claim 1, where the dielectric layer is comprised of a first layer of $SiO_2$ fused to a second layer of $SiO_2$.

* * * * *